(12) United States Patent
Yamada (10) Patent No.: US 10,993,296 B2
(45) Date of Patent: *Apr. 27, 2021

(54) LIGHT-EMITTING MODULE AND INTEGRATED LIGHT-EMITTING MODULE

(71) Applicant: NICHIA CORPORATION, Anan (JP)

(72) Inventor: Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/731,236

(22) Filed: Dec. 31, 2019

(65) Prior Publication Data

US 2020/0137842 A1     Apr. 30, 2020

Related U.S. Application Data

(63) Continuation of application No. 16/167,387, filed on Oct. 22, 2018.

(30) Foreign Application Priority Data

Oct. 23, 2017     (JP) .............................. JP2017-204528

(51) Int. Cl.
| | |
|---|---|
| *H05B 33/02* | (2006.01) |
| *H01L 33/50* | (2010.01) |
| *H01L 33/54* | (2010.01) |
| *H01L 33/62* | (2010.01) |
| *H01L 33/46* | (2010.01) |
| *H01L 33/60* | (2010.01) |

(Continued)

(52) U.S. Cl.
CPC .............. *H05B 33/02* (2013.01); *H01L 33/46* (2013.01); *H01L 33/50* (2013.01); *H01L 33/54* (2013.01); *H01L 33/60* (2013.01); *H01L 33/62* (2013.01); *H01L 33/44* (2013.01); *H01L 33/58* (2013.01)

(58) Field of Classification Search
CPC ......... H05B 33/02; H01L 33/46; H01L 33/50; H01L 33/54; H01L 33/60; H01L 33/62; H01L 33/44; H01L 33/58
See application file for complete search history.

(56) References Cited

U.S. PATENT DOCUMENTS

| | | |
|---|---|---|
| 2011/0198644 A1 | 8/2011 | Hwang et al. |
| 2013/0300285 A1 | 11/2013 | Ito |
| 2017/0122529 A1 | 5/2017 | Yamada |

(Continued)

FOREIGN PATENT DOCUMENTS

| | | |
|---|---|---|
| EP | 3279550 A1 | 2/2018 |
| JP | 2011-171740 A | 9/2011 |

(Continued)

*Primary Examiner* — Mary Ellen Bowman
(74) *Attorney, Agent, or Firm* — Foley & Lardner LLP (57) ABSTRACT

A light-emitting module includes: a base body including electrical conductor wirings; a light-emitting element disposed on the base body and electrically connected to the electrical conductor wirings; a light reflection film disposed on an upper surface of the light-emitting element; and a half mirror disposed on a light extraction surface side of the light-emitting element and spaced apart from the light-emitting element. A spectral reflectance of the half mirror under perpendicular incidence at a wavelength longer than a peak emission wavelength of a light emitted from the light-emitting element is greater than a spectral reflectance of the half mirror under perpendicular incidence at the peak emission wavelength.

16 Claims, 5 Drawing Sheets

(51) Int. Cl.
*H01L 33/44* (2010.01)
*H01L 33/58* (2010.01)

(56) References Cited

U.S. PATENT DOCUMENTS

2018/0341152 A1  11/2018  Yamashita et al.
2019/0027659 A1  1/2019  Yamada

FOREIGN PATENT DOCUMENTS

| JP | 2013-250472 A | 12/2013 |
| JP | 2016-195004 A | 11/2016 |
| JP | 2017-084761 A | 5/2017 |
| JP | 2017-092021 A | 5/2017 |
| WO | WO 2012/099145 A1 | 7/2012 |

LIGHT-EMITTING MODULE AND INTEGRATED LIGHT-EMITTING MODULE

CROSS-REFERENCE TO RELATED APPLICATIONS

This application is a continuation of U.S. patent application Ser. No. 16/167,387, filed Oct. 22, 2018, which claims priority to Japanese Patent Application No. 2017-204528, filed on Oct. 23, 2017, the contents of which are hereby incorporated by reference in their entirety.

BACKGROUND

The present disclosure relates to a light-emitting module and an integrated light-emitting module.

In recent years, as a backlight for a display device such as a liquid crystal display device, direct-type surface emission modules including a semiconductor light-emitting element have been proposed. In view of functionality, design, etc., the thickness of such display devices is required to be reduced in some cases, and thus, the thickness of the backlights for such display devices also needs to be reduced. Moreover, a reduction in the thickness of light-emitting modules for general illumination applications may also be required, in view of functionality, design, etc.

Reduction in the thickness of a light-emitting module for such use generally tends to cause unevenness in luminance at the emission surface. In particular, when a plurality of light-emitting elements are arranged in a one-dimensional or two-dimensional array, luminance will be higher in a region directly above the light-emitting elements than in their surrounding region. Therefore, for example, PCT Publication No. WO2012/099145 describes a technique in which a diffusive member is disposed on a portion a surface of a resin body, which seals a light-emitting element and also functions as a lens, near a region directly above the light-emitting element, to enhance the uniformity of light emitted from the light source.

SUMMARY

The present disclosure provides a light-emitting module in which unevenness in luminance is reduced.

In one embodiment, a light-emitting module comprises: a base body including electrical conductor wirings; a light-emitting element disposed on the base body to be electrically connected to the electrical conductor wirings; a light reflection film disposed on an upper surface of the light-emitting element; and a half mirror disposed on a light extraction surface side of the light-emitting element and spaced apart from the light-emitting element, wherein a spectral reflectance of the half mirror under perpendicular incidence at a wavelength longer than a peak emission wavelength of a light emitted from the light-emitting element is greater than a spectral reflectance of the half mirror under perpendicular incidence at the peak emission wavelength.

According to certain embodiments described in the present disclosure, a light-emitting module in which unevenness in luminance is reduced between a region above a light-emitting element and a region surrounding the region above the light-emitting element.

DETAILED DESCRIPTION

Hereinafter, embodiments of a light-emitting module and an integrated light-emitting module according to the present disclosure will be described with reference to the drawings. The light-emitting module and integrated light-emitting module described below are exemplary embodiments, and various modifications can be made to the embodiments described below. In the description below, terms indicating a direction or position (e.g., "above", "below", "right", "left", or other terms similar to such terms) may be used. Such terms will be used for easier understanding of the relative directions and positions in the drawings referred to. The relative relationships of directions or positions in referenced drawings, as indicated by terms such as "above", "below", "right", "left", etc., may be the same as those in drawings other than those of the present disclosure, in products, or the like, while arrangements of components in the referenced drawings may not be the same as arrangements of corresponding components in drawings other than those of the present disclosure, in products, or the like. The size, the positional relationship or the like of structural elements in the drawings may be exaggerated for easier understanding and may not reflect the sizes, or the positional relationship between the structural elements in the actual light-emitting module. In order to prevent excessive complexity, some elements may be omitted from illustration in schematic cross-sectional views or the like.

First Embodiment

Figure 1A:
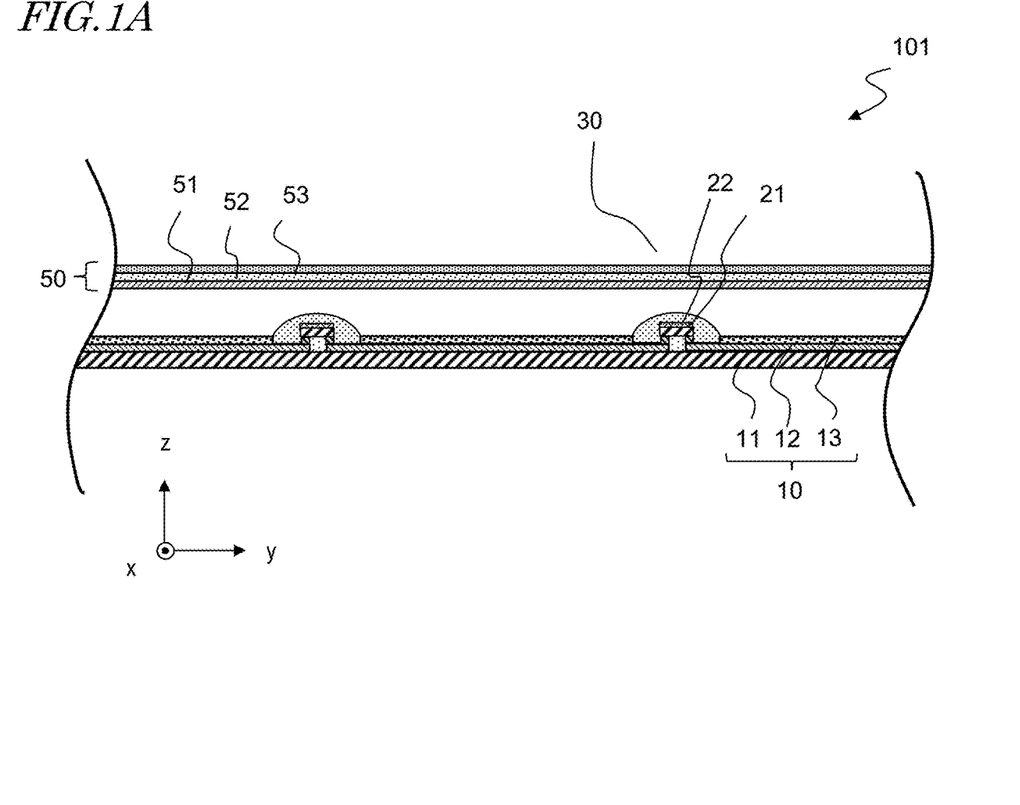
FIG. 1A is a cross-sectional view showing an exemplary light-emitting module according to a first embodiment.
Figure 1B:
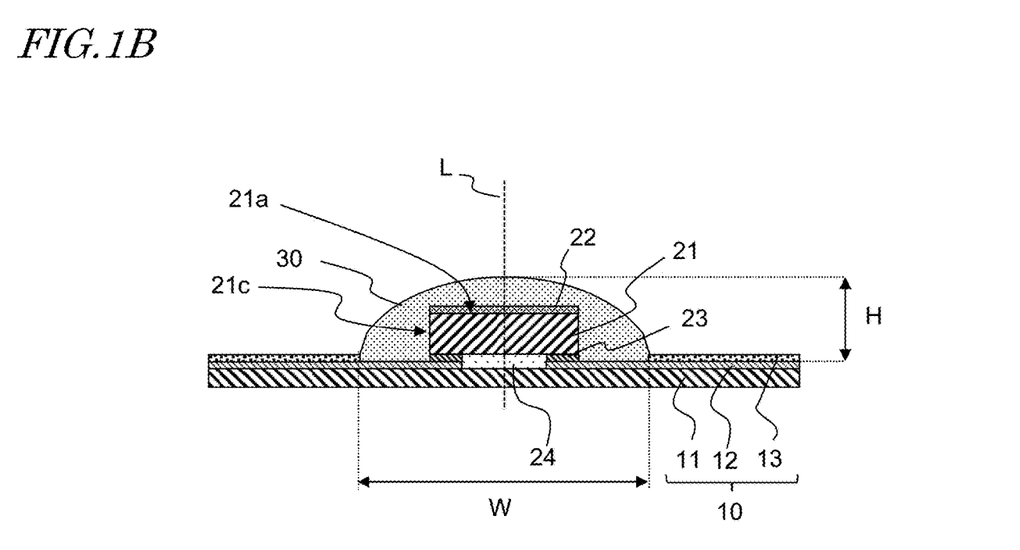
FIG. 1B is a cross-sectional enlarged view showing a portion of the light-emitting module shown in FIG. 1A.

FIG. 1A is a schematic diagram showing a partial cross-sectional structure of a light-emitting module 101 according to the present embodiment. FIG. 1B is a schematic enlarged diagram showing a partial cross-sectional structure of the light-emitting module 101. The light-emitting module 101 includes a base body 10, a light-emitting element(s) 21, a light reflection film 22, and a half mirror 51. Hereinafter, the respective component elements will be described in detail.

Base Body 10

The base body 10 has an upper surface and supports the light-emitting element(s) 21. The base body 10 also supplies electric power to the light-emitting element(s) 21. The base body 10 includes a substrate 11 and electrical conductor wirings 12, for example. The base body 10 may further include an insulating layer 13.

The substrate 11 may be made of, for example, a resin such as a phenolic resin, an epoxy resin, a polyimide resin, a BT resin, polyphthalamide (PPA), or polyethyleneterephthalate (PET), a ceramic, or the like. Among these, in view of cost reduction and ease of molding, an electrically insulating resin is preferably chosen. Alternatively, in order to realize a light-emitting module having good thermal resistance and light resistance, a ceramic may be selected as a material of the substrate 11. Examples of such ceramics include, alumina, mullite, forsterite, glass ceramics, nitride-based ceramics (e.g. AlN), and carbide-based ceramics (e.g. SiC). Among these, ceramics made of alumina, or ceramics containing alumina as a main component are preferable.

In the case in which a resin is used as a material of the substrate 11, an inorganic filler such as glass fibers, $SiO_2$, $TiO_2$, or $Al_2O_3$ may be mixed in the resin to improve the mechanical strength, reduce the coefficient of thermal expansion, improve the light reflectance, etc. The substrate 11 may be a composite plate in which an insulating layer is formed on a metal plate.

The electrical conductor wiring 12 has a predetermined wiring pattern. The electrical conductor wiring 12 is electrically connected to electrodes of the light-emitting element 21 to allow electric power to be supplied from external components to the light-emitting element 21. The wiring pattern includes a positive wiring that is connected to a positive electrode of the light-emitting element 21 and a negative wiring that is connected to a negative electrode of the light-emitting element 21. The electrical conductor wiring 12 is disposed at least on an upper surface of the base body 10 that serves as a surface on which the light-emitting element 21 is to be mounted. A material of the electrical conductor wiring 12 may be appropriately selected from electrically conductive materials in accordance with a material of the substrate 11, a method of producing the substrate 11, and so on. For example, when a ceramic is used as a material of the substrate 11, a material of the electrical conductor wiring 12 is preferably a high-melting point material that can withstand the baking temperature of the ceramic sheet; for example, a metal having a high melting point such as tungsten or molybdenum is preferably used. On the wiring pattern of a high-melting point metal, a layer of another metal material, e.g., nickel, gold, or silver, may further be provided by plating, sputtering, vapor deposition, or the like.

In the case in which a resin is used as a material of the substrate 11, a material that is easy to process is preferably used as a material of the electrical conductor wiring 12. In the case in which a resin is injection-molded to be used as a material of the substrate 11, a material that is easily subject to processing such as a punching processing, an etching processing, a bending processing, or the like and has a relatively large mechanical strength is preferably used as a material of the electrical conductor wiring 12. More specifically, the electrical conductor wiring 12 is preferably a metal layer, a lead frame, etc., made of a metal such as copper, aluminum, gold, silver, tungsten, iron, nickel, an iron-nickel alloy, phosphor bronze, iron-containing copper, molybdenum, or the like. Moreover, on a surface of a wiring pattern of such a metal, the electrical conductor wiring 12 may further include an additional layer of metal material. An appropriate material may be used for the additional layer, and for example, a layer made of only silver, or a layer made of an alloy containing silver and copper, gold, aluminum, rhodium, or the like may be used. Alternatively, a multilayer structure containing silver and/or such an alloy may be used for the additional layer. The additional layer of metal material may be formed by plating, sputtering, vapor deposition, or the like.

Insulating Layer 13

The base body 10 may include an insulating layer 13. In the base body 10, the insulating layer 13 is disposed on the substrate 11 to cover a portion of the electrical conductor wiring 12 to which the light-emitting element 21 and the like are connected. In other words, the insulating layer 13 is electrically insulating, and covers at least a portion of the electrical conductor wiring 12. The insulating layer 13 preferably has a light-reflecting property. With the insulating layer 13 having a light-reflecting property, light that is emitted from the light-emitting element 21 toward the base body 10 is reflected by the insulating layer 13, so that the light extraction efficiency can be improved. Moreover, with the insulating layer 13 having a light-reflecting property, among the light emitted from a light source and is incident on a light-transmissive layered structure including a diffusion plate, a wavelength conversion member, or the like, for example, a light reflected at the light-transmissive layered structure to return toward the base body 10 is also reflected by the insulating layer 13, so that the light extraction efficiency can be improved. Such light reflected at the base body is also transmitted through the light-transmissive layered structure, so that unevenness in luminance can be further reduced.

Any appropriate material that absorbs little light emitted from the light-emitting element 21 and is electrically insulating may be used for the insulating layer 13. For example, resin materials such as epoxies, silicones, modified silicones, urethane resins, oxatane resins, acrylics, polycarbonates, or polyimides may be used. In the case in which light-reflecting property is imparted to the insulating layer 13, in the insulating layer 13, a resin material as described above may contain a white-based color filler that is the same as that to be added to an underfill material described below. The white-based color filler will be described in detail below.

Light-Emitting Element 21

The light-emitting module 101 includes one or more light-emitting elements 21 that are disposed on the base body 10. When the light-emitting module 101 includes a plurality of light-emitting elements 21, the light-emitting elements 21 are arranged in a one-dimensional or two-dimensional array on the base body 10. For the light-emitting element(s) 21 disposed on the base body 10, various kinds of light-emitting element(s) can be used. Each light-emitting element 21 is a light-emitting diode in the present embodiment. The wavelength of the light to be emitted from the light-emitting element 21 can be appropriately selected. For example, for a blue or green light-emitting element, a light-emitting element using a semiconductor such as a nitride-based semiconductor (e.g., $In_xAl_yGa_{1-x-y}N$, $0 \leq X$, $0 \leq Y$, $X+Y \leq 1$), ZnSe, or GaP can be used. For a red light-emitting element, a light-emitting element using a semiconductor such as GaAlAs or AlInGaP can be used. A semiconductor light-emitting element made of a material other than these materials may alternatively be used. The number of light-emitting elements to be used and their composition, emission color, size, etc., may be appropriately selected in accordance with the purpose.

In the case in which light emitted from the light-emitting element 21 is subjected to wavelength conversion using a wavelength conversion member, a nitride semiconductor ($In_xAl_yGa_{1-x-y}N$, $0 \leq X$, $0 \leq Y$, $X+Y \leq 1$) that emits light of a shorter wavelength that can efficiently excite a wavelength conversion material contained in the wavelength conversion member is preferably used for the light-emitting element 21. Various emission wavelengths can be selected based on a material and a ratio of mixed crystals of the semiconductor layers. The light-emitting element 21 may have a positive electrode and a negative electrode at the same surface or different surfaces of the light-emitting element 21.

Each light-emitting element 21 includes, for example, a growth substrate and semiconductor layers layered on the growth substrate. The semiconductor layers include an n-semiconductor layer, a p-semiconductor layer, and an active layer disposed therebetween. The negative electrode and the positive electrode are electrically connected to the n-semiconductor layer and the p-semiconductor layer, respectively. For the growth substrate, for example, a light-transmissive sapphire substrate or the like can be used.

The n-side electrode and the p-side electrode of the light-emitting element 21 are flip-chip mounted on the base body 10, via connection members 23. More specifically, by the connection members 23, the p-side electrode and the n-side electrode of the light-emitting element 21 are electrically connected to the positive wiring and the negative wiring, respectively, that are included in the electrical conductor wiring 12 of the base body 10. A surface of the light-emitting element 21 opposite to a surface thereof where the n-side electrode and the p-side electrode are disposed, i.e., an upper surface 21a, which is a principal surface of a light-transmissive sapphire substrate, serves as a light exiting surface. In the present embodiment, in order to reduce the luminance directly above the light-emitting element 21, the light reflection film 22 is disposed on the upper surface 21a of the light-emitting element 21. With this arrangement, a lateral surface 21c of the light-emitting element 21 serves as the primary light extraction surface.

Connection Member 23

As described above, by the connection members 23, the p-side electrode and n-side electrode are connected to the positive wiring and negative wiring, respectively, of the electrical conductor wirings. The connection members 23 contain an electrically conductive material. Examples of a material of the connection members 23 include an Au-containing alloy, an Ag-containing alloy, a Pd-containing alloy, an In-containing alloy, a Pb—Pd-containing alloy, an Au—Ga-containing alloy, an Au—Sn-containing alloy, an Sn-containing alloy, an Sn—Cu-containing alloy, an Sn—Cu—Ag-containing alloy, an Au—Ge-containing alloy, an Au—Si-containing alloy, an Al-containing alloy, a Cu—In-containing alloy, a mixture of a metal and flux, or the like.

The connection members 23 can be used in a liquid form, paste form, or solid form (e.g., in a form of sheets, blocks, powder, or wires). A form of the connection members 23 may be appropriately selected in accordance with the composition, shape of a base body, or the like. Each such connection member 23 may be made of a single member, or a combination of several types of members.

Underfill Member 24

An underfill member 24 may be provided between the light-emitting element 21 and the base body 10. The underfill member 24 preferably contains a filler, for the purposes of allowing light emitted from the light-emitting element 21 to be efficiently reflected, having a coefficient of thermal expansion closer to that of the light-emitting element 21, or the like. In the present embodiment, because the lateral surface 21c of the light-emitting element 21 also serves as a light extraction surface, the underfill member 24 preferably does not cover the lateral face 21c, as shown in FIGS. 1A and 1B.

As a base material of the underfill member 24, the underfill member 24 contains a material that absorbs little light from the light-emitting element. For example, epoxies, silicones, modified silicones, urethane resins, oxatane resins, acrylics, polycarbonates, polyimides, and the like can be used as the base material of the underfill member 24.

For the filler of the underfill member 24, using a white-type filler may allow light to be reflected more easily, thus improving the light extraction efficiency. An inorganic compound is preferably used for the filler. As used herein, the expression "white" includes the case in which the filler itself is transparent but appears to be white when scattering occurs due to difference between a refractive index of the filler and that of a material surrounding the filler.

The reflectance of the filler is preferably 50% or more, and more preferably 70% or more, with respect to a light of the emission wavelength of the light-emitting element 21. This allows the light extraction efficiency of the light-emitting module 101 to be improved. The particle size of the filler is preferably in a range of 1 nm to 10 μm. With the filler having a particle size in this range, the underfill material will have a good resin fluidity, so that the material serving as the underfill member 24 can be introduced even through a narrow space. The particle size of the filler is preferably in a range of 100 nm to 5 μm, and more preferably in a range of 200 nm to 2 μm. The filler may have a spherical shape or a flake shape.

Specific examples of the filler material include: oxides such as $SiO_2$, $Al_2O_3$, $Al(OH)_3$, $MgCO_3$, $TiO_2$, $ZrO_2$, $ZnO$, $Nb_2O_5$, $MgO$, $Mg(OH)_2$, $SrO$, $In_2O_3$, $TaO_2$, $HfO$, $SeO$, and $Y_2O_3$; nitrides such as SiN, AlN, and AlON; and fluorides such as $MgF_2$. These may be used singly, or they may be used in a mixture.

Light Reflection Film 22

The light reflection film 22 reflects a portion of an incident light, and transmits another portion of the incident light. The light reflection film 22 is disposed on the upper surface 21a of the light-emitting element 21. With this structure, a portion of light emitted from the upper surface 21a of the light-emitting element 21 is reflected by the light reflection film 22, returns to the light-emitting element 21, and is emitted through the lateral surface 21c of the light-emitting element 21. As a result, the amount of light emitted from the upper surface 21a of the light-emitting element 21 can be reduced; luminance above the light-emitting element 21 can be reduced; and unevenness in luminance can be reduced when the light-emitting module 101 is used to configure a backlight or the like.

The reflectance of the light reflection film 22 is preferably in a range of 20% to 80% with respect to the peak emission wavelength of the light-emitting element 21. With the reflectance less than 20%, the amount of light emitted from the upper surface 21a is not sufficiently decreased, so that unevenness in luminance is not sufficiently reduced. With the reflectance greater than 80%, the amount of light that is emitted from the upper surface 21a is excessively decreased, so that, even with the use of the half mirror 51 to be described below, the luminance in the region above the upper surface 21a is lower than that in the surrounding region, which may lead to difficulty in reduction in unevenness in luminance.

It is preferable that the light reflection film 22 allow 30% or more of the total amount of light emitted from the light-emitting element 21 to be emitted at an angle of elevation less than 20° with respect to the upper surface of the base body 10. The reflectance of the light reflection film 22 can be adjusted so that light will be emitted from the light-emitting element 21 with such light-distribution characteristics.

The light reflection film 22 can be a metal film, a multilayered dielectric film, or the like. It is preferable that a material that does not easily absorb light emitted from the light-emitting element 21 be used.

Sealing Member 30

The light-emitting module 101 may include a sealing member 30. The sealing member 30 protects the light-emitting element(s) 21 from the external environment, and optically controls the light-distribution characteristics of the light to be emitted from the light-emitting element(s) 21. More specifically, refraction of light at the outer surface of the sealing member 30 allows for adjusting the direction of light emission. The sealing member 30 is disposed on the base body 10 to cover the light-emitting element(s) 21.

The surface of the sealing member 30 is a convex curved surface. In top view, the sealing member 30 preferably has a circular or elliptic outer shape. In the sealing member 30, a ratio H/W between the height H along the optical axis L and the width W in top view is preferably smaller than 0.5. More preferably, H/W is 0.3 or smaller. The height H of the sealing member 30 is defined by an interval between a mounting surface of the base body 10 and the highest portion of the sealing member 30, as taken along the optical axis L. The width W is based on the shape of the bottom surface of the sealing member 30. When the bottom surface of the sealing member 30 has a circular shape, the width W refers to the diameter of the circle. When the bottom surface of the sealing member 30 has another shape, the width W refers to the minimum width of the bottom face. For example, when the outer shape of the bottom surface in top view is an ellipse, the bottom surface has both a major axis and a minor axis, and the minor axis refers to the width W of the bottom surface. With the sealing member 30 having this shape, light emitted from the light-emitting element 21 can be refracted at the interface between the sealing member 30 and an air, so that a wider light distribution can be achieved.

Example of a material of the sealing member 30 include a light-transmitting resin such as an epoxy resin, a silicone resin or a mixed resin thereof and glass. Among these, in view of light resistance and ease of molding, a silicone resin is preferably selected.

The sealing member 30 may contain a wavelength conversion material and a diffusion agent for diffusing the light emitted from the light-emitting element 21. Moreover, the sealing member 30 may contain a coloring agent corresponding to the emission color of the light-emitting element. In the sealing member 30, such a wavelength conversion material, a diffusion material, a coloring agent, etc., are preferably contained at amounts that allow light distribution to be controlled on the basis of the outer shape of the sealing member 30. In order to reduce influence on the light-distribution characteristics, the particle size of any material contained in the sealing member 30 is preferably 0.2 μm or less. In the present specification, the expression "particle size" refers to an average particle size (i.e., median diameter), and the value of an average particle size can be measured by laser diffractometry.

Half Mirror 51

The half mirror 51, which reflects a portion of an incident light and transmits another portion of the incident light, is disposed above the upper surface 21a of the light-emitting element(s) 21. It is preferable that the half mirror 51 be sufficiently large relative to the light-emitting element 21 so that even light emitted from the light-emitting element 21 at a small angle of elevation can be incident on the half mirror 51. In the case in which a plurality of light-emitting elements 21 are arranged on the base body 10, the half mirror 51 has a sufficient size for covering over the upper surfaces 21a of the plurality of light-emitting elements 21. The half mirror 51 may be supported by a housing that holds the light-emitting module 101, for example.

In the case in which the light-emitting module 101 further includes a wavelength conversion member 52, a light-transmissive layer 53, which will be described below, or the like, the half mirror 51, the wavelength conversion member 52, the light-transmissive layer 53 and the like are stacked so as to constitute a light-transmissive layered structure 50, and the light-transmissive layered structure 50 may be supported by a housing that holds the light-emitting module 101, etc. In this case, in the light-transmissive layered structure 50, the half mirror 51 is preferably located closest to the light-emitting element 21.

Figure 2A:
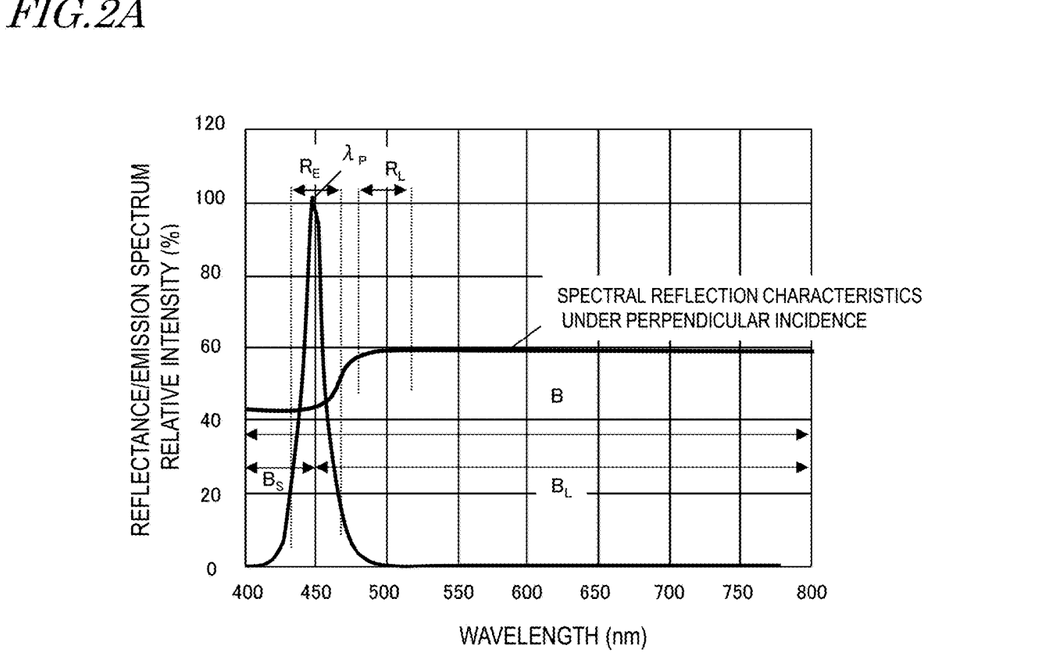
FIG. 2A is a diagram showing an example of spectral reflection characteristics with respect to light perpendicularly incident on a half mirror of the light-emitting module shown in FIGS. 1A and 1B.

In order to reduce unevenness in luminance between the region above the light-emitting element 21 and the region surrounding the region above the light-emitting element 21, the half mirror 51 has spectral reflectance characteristics including at least two regions with different spectral reflectances in the reflection wavelength band. FIG. 2A shows a schematic example of spectral reflectance characteristics of the half mirror 51 with respect to perpendicular incident light. A schematic example of an emission spectrum of light emitted from the light-emitting element 21 is also shown. As shown in FIG. 2A, the half mirror 51 has reflection characteristics in which a spectral reflectance of the half mirror 51 under perpendicular incidence at the longer wavelength side $B_L$ than a peak emission wavelength of a light emitted from the light-emitting element 21 is greater than a spectral reflectance of the half mirror 51 under perpendicular incidence at the peak emission wavelength.

The half mirror 51 preferably has spectral reflectance characteristics in which the spectral reflectance as described above in a region $R_L$, which is located 50 nm from the peak emission wavelength region $R_E$ on the longer wavelength side, is 10% or more greater than the spectral reflectance in the peak emission wavelength region $R_E$ of the light-emitting element 21. As used herein, the expression "spectral reflectance" refers to a value with respect to perpendicular incident light. The "emission peak wavelength region $R_E$" is a wavelength region with a predetermined width including a peak emission wavelength $\lambda_p$ of the light-emitting element 21 as the center thereof. For example, the peak emission wavelength region $R_E$ may be a wavelength region in a range of $\lambda_{E1}$ and $\lambda_{E2}$ ($\lambda_{E1} < \lambda_{E2}$). The bandwidth of the peak emission wavelength region $R_E$ is determined based on the characteristics of light that is emitted from the light-emitting element 21. For example, in the case in which the light-emitting element 21 is an LED that emits blue light, the bandwidth of the emission peak wavelength region $R_E$ may be $\lambda_p \pm 20$ nm.

The "region $R_L$" is a region including a region where the maximum wavelength and the minimum wavelength are are located 50 nm longer wavelength side of the maximum wavelength and the minimum wavelength, respectively, of the emission peak wavelength region $R_E$. More specifically, the region $R_L$ is a wavelength region in a range of $(\lambda_{E1}+50)$ nm and $(\lambda_{E2}+50)$ nm. The expression "the spectral reflectance in the region $R_L$ is 10% or more greater than the spectral reflectance in the emission peak wavelength region $R_E$ of the light-emitting element 21" refers to that the spectral reflectance at any wavelength in the region $R_L$ is 10% or more greater than the largest spectral reflectance in the emission peak wavelength region $R_E$. The spectral reflectance in the emission peak wavelength region $R_E$ is in a range of 30% to 65%. Therefore, the spectral reflectance in the region $R_L$ is in a range of 40% to 75%. The emission peak wavelength region $R_E$ and the region $R_L$ do not overlap each other. For example, the spectral reflectance of the half mirror 51 may be constant within each of a longer wavelength region, which includes the region $R_L$, and a shorter wavelength region, which includes the emission peak wavelength region $R_E$.

A reflection wavelength band B under perpendicular incidence refers to a region including the peak emission wavelength region $R_E$ and region $R_L$, and having the spectral reflectance of 40% or more and a wavelength range of 400 nm to 800 nm. The reflection wavelength band B of the half mirror 51 includes the peak emission wavelength of the light-emitting element 21, and the longer wavelength side width $B_L$ with respect to the peak emission wavelength is wider than the shorter wavelength side width $B_S$.

The half mirror 51 is light-transmissive, and includes a multilayered dielectric film structure in which a plurality of insulating layers having different refractive indices is layered. Examples of specific materials of the insulating layers include a material that absorbs little light in the wavelength region of emission from the light-emitting element 21, such as a metal oxide film, a metal nitride film, a metal fluoride film, and an organic material. Moreover, an organic layer of a silicone resin, a fluororesin, or the like may be used for the insulating layers.

The spectral reflectance characteristics of the half mirror 51, more specifically, the positions of the peak emission wavelength region $R_E$ and region $R_L$, spectral reflectance, etc., may be appropriately set through adjustments of the thicknesses of the insulating layers, refractive indices of the insulating layers, or the number of insulating layers of multilayered dielectric film, or the like. The spectral reflectances, etc., of the emission peak wavelength region $R_E$ and region $R_L$ can be separately designed.

Wavelength Conversion Member 52

In the case in which the sealing member 30 does not contain a wavelength conversion material, the light-emitting module 101 may further include a wavelength conversion member 52. The wavelength conversion member 52 is spaced apart from the light-emitting element 21, and is disposed on a light extraction surface side of the light-emitting element. The wavelength conversion member 52 is preferably spaced apart also from the sealing member 30. The wavelength conversion member 52 absorbs a portion of light emitted from the light-emitting module 101, and emit light of a wavelength different from the wavelength of light emitted from the light-emitting module 101. With the wavelength conversion member 52 apart from the light-emitting element 21 of the light-emitting module 101, even light conversion substances of small heat resistance or light resistance, which would be difficult to use near the light-emitting element 21, can be used. Accordingly, the performance of the light-emitting module 101 as a backlight can be improved. The wavelength conversion member 52 is in a form of a sheet or a layer, and contains a wavelength converting substance.

Examples of the wavelength converting substance include yttrium aluminum garnet (YAG)-based fluorescent materials activated by cerium, lutetium aluminum garnet (LAG) activated by cerium, nitrogen-containing calcium aluminosilicate ($CaO—Al_2O_3—SiO_2$)-based fluorescent materials activated by europium and/or chromium, silicate ($(Sr,Ba)_2SiO_4$)-based fluorescent materials activated by europium, βSiAlON fluorescent materials, nitride-based fluorescent materials such as CASN-based or SCASN-based fluorescent materials, KSF-based fluorescent materials ($K_2SiF_6$: Mn), and sulfide-based fluorescent materials. A fluorescent material other than these fluorescent materials that exhibits similar performance, action, and effects may also be used.

The wavelength conversion member 52 may contain, for example, a light-emitting substance such as so-called nanocrystals or quantum dots. For these materials, semiconductor materials can be used. Examples thereof include II-VI group, III-V group, and IV-VI group semiconductors, and more specifically, nano-sized high-dispersion particles of CdSe, core shell-type $CdS_xSe_{1-x}/ZnS$, GaP, or the like.

Light-Transmissive Layer 53

The light-emitting module 101 may further include one or more light-transmissive layers 53. Each light-transmissive layer 53 may be a diffusion plate, a prism sheet, a reflective polarization sheet, or the like. The diffusion plate diffuses and transmits incident light. The diffusion plate may be made of a material with a small light absorption with respect to visible light, e.g., a polycarbonate resin, a polystyrene resin, an acrylic resin, or a polyethylene resin. The diffusion plate may have a structure for diffusing light provided thereon, such as irregularities on a surface of the diffusion plate, or dispersion of a material having a refractive index different from the diffusion plate in the diffusion plate. For the diffusion plate, a diffusion plate commercially available under names such as light a diffusing sheet, a diffuser film, etc., may be used.

With an increase in a perpendicular component of the light emitted from the light-transmissive layered structure 50, the prism sheet enhances the luminance when the emission plane of the light-emitting module 101 is viewed from the front side.

A reflective polarization sheet is also called a luminance enhancement film. Of the light emitted from the light-emitting element 21, the reflective polarization sheet may transmit P-polarized light and reflect S-polarized light toward the light-emitting element 21, for example. The S-polarized light having been reflected by the reflective polarization sheet is reflected by the half mirror 51, the wavelength conversion member 52, and the upper surface of the base body 10, and converted into P-polarized light. The converted P-polarized light is transmitted through the reflective polarization sheet and emitted toward the outside. In this manner, the proportion of the P-polarized light component in the light emitted from the light-emitting module 101 can be increased.

Light-Emission and Effect of Light-Emitting Module 101

In the light-emitting module 101, the light reflection film 22 is disposed on the upper surface 21a of the light-emitting element 21. With this structure, a portion of light emitted from the upper surface 21a of the light-emitting element 21 is reflected at the light reflection film 22, returns to the light-emitting element 21, and is emitted through the lateral surface 21c of the light-emitting element 21. Accordingly, the amount of light emitted through the upper surface of the light-emitting element 21 can be reduced, which allows for reducing the luminance in a region above the light-emitting element 21, so that unevenness in luminance can be reduced when a backlight or the like is configured using the light-emitting module 101.

According to the study of the inventors, when a multilayered dielectric film is disposed on the upper surface of the light-emitting element and a diffusion plate or the like is disposed on the light-emitting side of the light-emitting module to form a backlight, a reduction in the distance between the diffusion plate and the light-emitting element allows the luminance near a region above the light-emitting element to be smaller than that of a region surrounding the region above the light-emitting element.

Figure 3A:
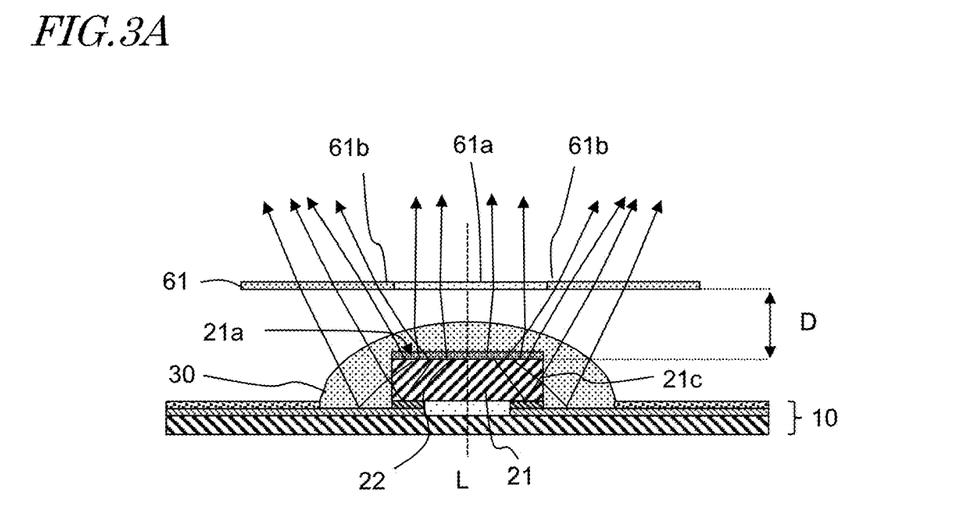
FIG. 3A is a schematic diagram showing travel of light in an exemplary light-emitting module in which a light reflection film 22 is provided on the upper surface of the light-emitting element and a diffusion plate is disposed above the upper surface of the light-emitting element.

FIG. 3A shows a schematic cross-sectional view of an exemplary light-emitting module 100 in which a light reflection film 22 is disposed on the upper surface of the light-emitting element 21 and a diffusion plate 61 is disposed above the upper surface 21a.

Figure 3B:
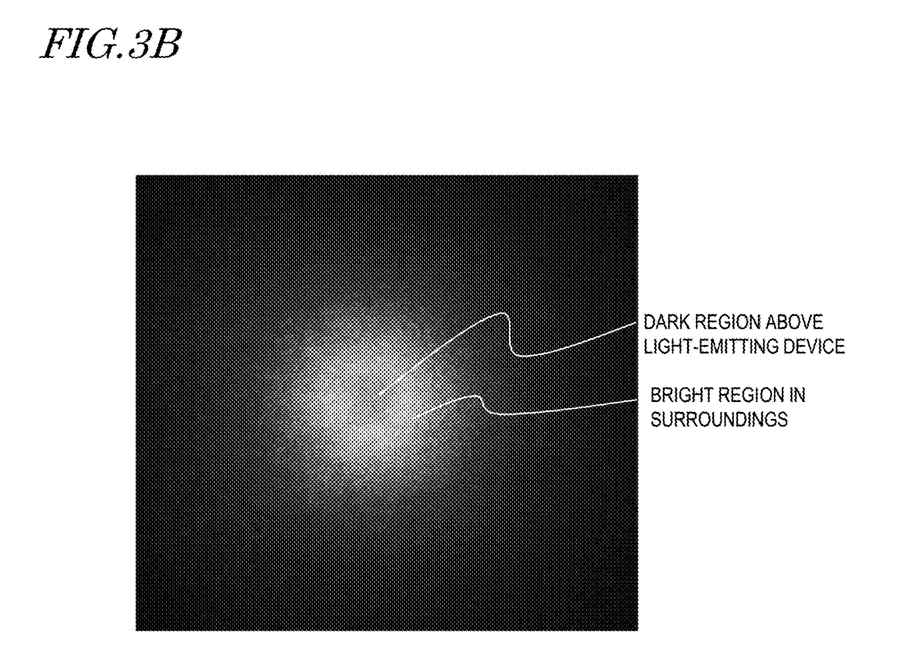
FIG. 3B is a diagram illustrating emission by the light-emitting module shown in FIG. 3A.

FIG. 3B shows an example of observed light emission by a prototyped light-emitting module 100, when viewed from its upper surface side.

With reduction in the interval D between the diffusion plate 61 and the light-emitting element 21, in the diffusion plate 61, a light that has perpendicularly emitted from the upper surface 21a of the light-emitting element 21 and has been transmitted through the light reflection film 22 is incident on a region 61a above the light-emitting element. On the other hand, light obliquely emitted from the upper surface 21a of the light-emitting element and transmitted through the light reflection film 22, and light reflected at the light reflection film 22 and then reflected at an inner portion of the light-emitting element 21 to be emitted from the upper surface 21a of the light-emitting element 21 and the lateral surface 21c are incident on a region 61b, which surrounds the region 61a. Thus, as shown in FIG. 3B, the luminance in the region above the light-emitting element 21 is lower than the luminance in the region surrounding the region above the light-emitting element 21, which may lead to an unevenness in luminance.

Figure 2B:
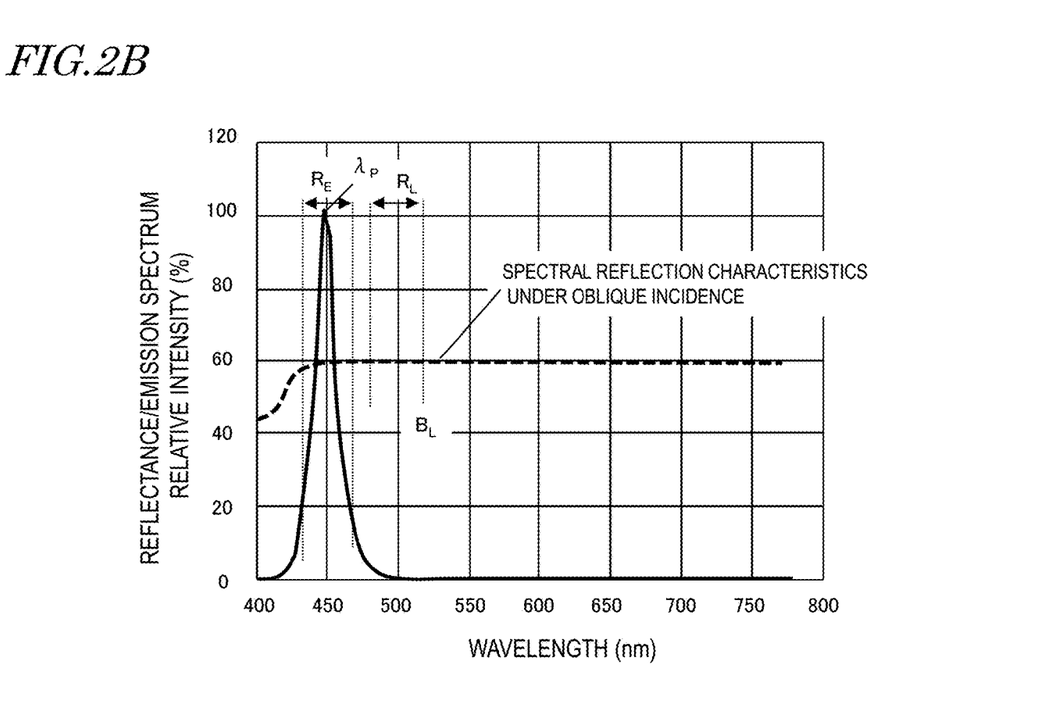
FIG. 2B is a diagram showing spectral reflection characteristics with respect to light obliquely incident, at 45°, on a half mirror having the spectral reflection characteristics shown in FIG. 2A.

In the light-emitting module 101 according to the present disclosure, an incident angle dependence of the spectral reflection characteristics of the half mirror 51 is used to reduce unevenness in luminance as described above. Generally, when a half mirror is made of a multilayered dielectric film, spectral reflection characteristics of a light perpendicularly incident on the half mirror 51 and that of a light obliquely incident on the half mirror 51 are different from each other. The optical path length of a light obliquely incident on the half mirror is longer than the optical path length of a light perpendicularly incident on the half mirror, which allows the reflection wavelength band to be shifted toward the shorter wavelength side. This is also called a "blue shift". FIG. 2B shows spectral reflectance characteristics with respect to light incident in a direction of 45° with respect to a direction perpendicular to the half mirror 51, where the half mirror 51 has the spectral reflectance characteristics show in FIG. 2A.

The light-emitting element 21 has a peak emission wavelength of about 450 nm, and a peak emission wavelength region $R_E$ is a range of 430 nm to 470 nm. The region $R_L$ is a range of 480 nm to 520 nm. The spectral reflectance in the peak emission wavelength region $R_E$ is about 42%, and the spectral reflectance in the region $R_L$ is about 60%. That is, while light perpendicularly incident on the half mirror 51 is reflected with a spectral reflectance of about 42%, light obliquely incident on the half mirror 51 is reflected with a spectral reflectance of about 60% at the maximum.

According a detailed study, in the case of a light-emitting element 21 for emitting, e.g. blue light, the amount of shift of 50 nm allows for increasing luminance in the region above the light-emitting element 21 while reducing luminance in the region surrounding the region above the light-emitting element 21, so that unevenness in luminance can be efficiently reduced.

Figure 4:
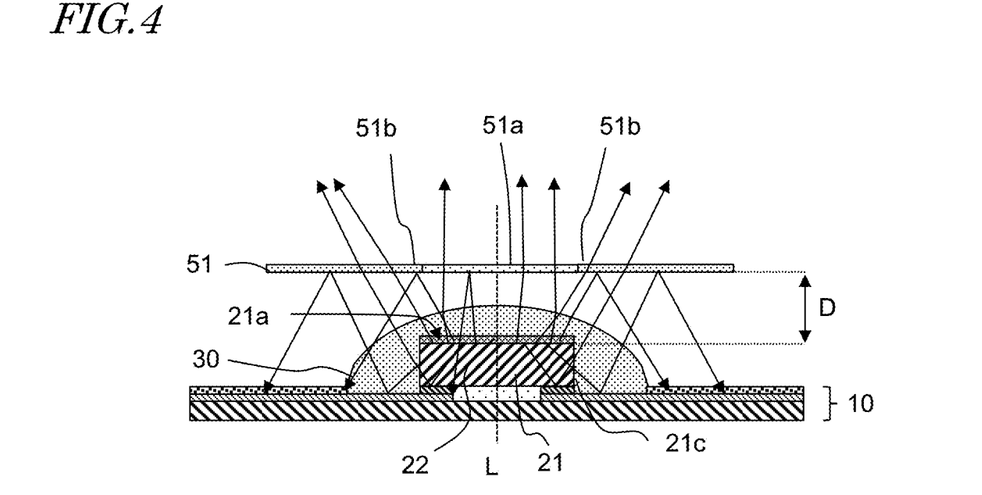
FIG. 4 is a schematic diagram showing light emission from the light-emitting element in the light-emitting module shown in FIGS. 1A and 1B.

FIG. 4 schematically shows travel of light emitted from the light-emitting element 21 in the light-emitting module 101. In the case in which the distance D between the upper surface 21a of the light-emitting element 21 and the half mirror 51 is small, as has been described with reference to FIG. 3A and FIG. 3B, a greater amount of light is incident on the region 51a above the light-emitting element 21 than on the region 51b surrounding the region 51a, in the half mirror 51.

Light incident on the region 51a of the half mirror 51 contains many components perpendicular to the half mirror 51. Thus, light incident on the region 51a is reflected at the half mirror 51 with a reflectance of about 42%; in other words, about 58% of light incident on the region 51a is transmitted through the half mirror 51. On the other hand, light incident on the region 51b contains many components oblique to the half mirror 51. Thus, light incident on the region 51b is reflected at the half mirror 51 with a reflectance of 60% at the maximum; i.e., about 40% of light incident on the region 51b is transmitted through the half mirror 51. This allows luminance in the region 51a of the half mirror 51 to be relatively increased, and luminance in the region 51b to be reduced, so that unevenness in luminance on the emission plane of the light-emitting module 101 can be reduced.

Thus, in the light-emitting module 101 according to the present disclosure, with the light reflection film 22 disposed on the upper surface 21a of the light-emitting element 21, light emitted from the light-emitting element 21 can be widely distributed. With this wide distribution, the luminance in the region directly above the light-emitting element 21 can be lower than the luminance surrounding the region directly above the light-emitting element 21, and thus the half mirror 51 having the characteristics as described above is employed so that light from the light-emitting element 21 will go out therethrough. This allows for reducing unevenness in luminance even when the distance D of the light-emitting module 101 is reduced, and thus a thin-type backlight can be realized.

Further, with the sealing member 30 having an outer shape with a convex curved surface, and with the ratio H/W of height to width smaller than 0.5, light emitted from the light-emitting element 21 can be even widely distributed. For example, with the ratio H/W of the height H to the width W of the sealing member 30 to be 0.3 or smaller, 40% or more of the total amount of light emitted from the light-emitting module 101 can be emitted at an angle of elevation that is less than 20° with respect to the upper surface of the base body 10. With the light reflection film 22 and the outer shape of the sealing member 30, it is possible to obtain desired light-distribution characteristics without using a secondary lens. That is, the light reflection film 22 allows for reducing luminance in a region above the light-emitting element 21, and thus the sealing member 30 mainly has the function of broadening distribution of the light emitted from the light-emitting element 21. This allows for greatly reducing the size the sealing member 30 having a lens function. Thus, with the light-emitting module 101, a thin backlight module (light-emitting module) in which unevenness in luminance is reduced can be realized.

Second Embodiment

Figure 5A:
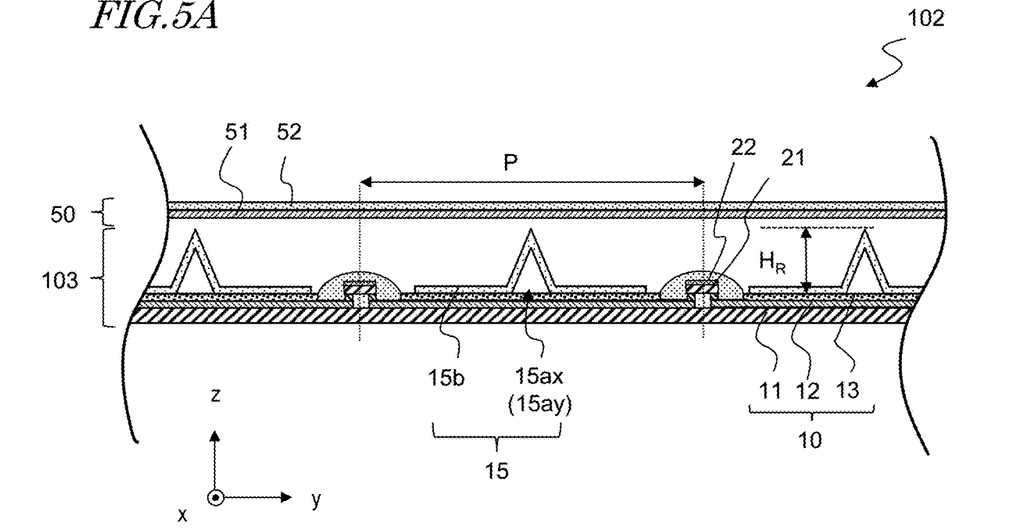
FIG. 5A is a cross-sectional view showing an exemplary light-emitting module according to a second embodiment.
Figure 5B:
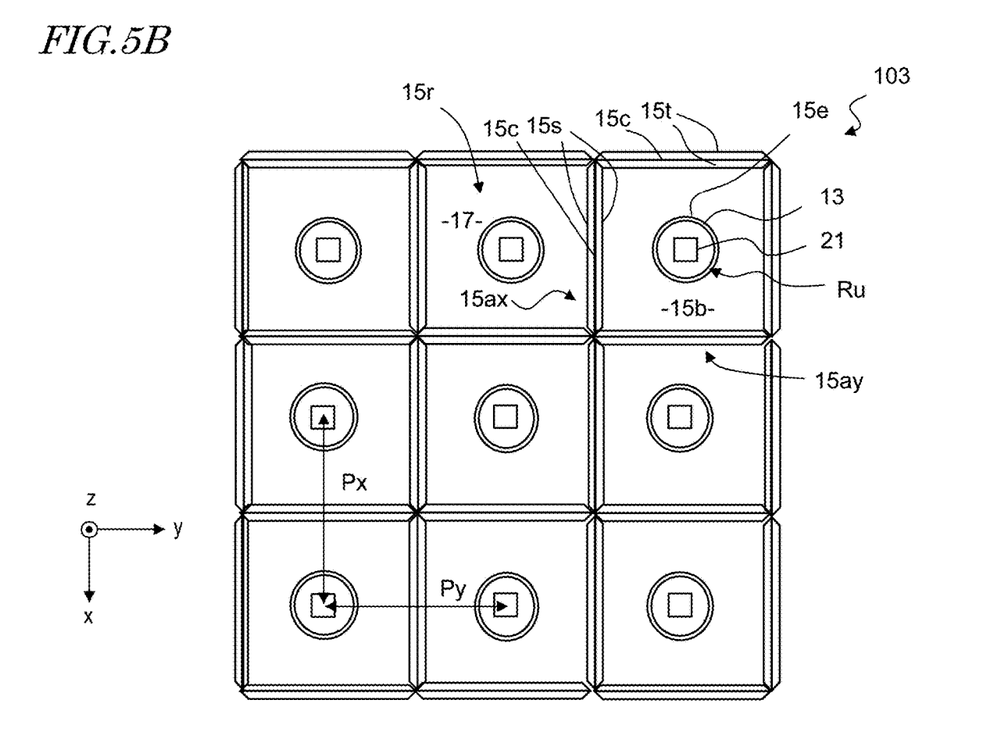
FIG. 5B is a top view of an integrated light-emitting device having light-emitting modules as shown in FIG. 5A.

FIG. 5A is a schematic diagram showing a cross-sectional structure of an integrated light-emitting module 102 according to the present embodiment. The integrated light-emitting module 102 includes a light-transmissive layered structure 50 and an integrated light-emitting device 103. FIG. 5B is a top view of the integrated light-emitting device 103.

The integrated light-emitting device 103 includes a base body 10, a plurality of light-emitting elements 21 arranged on the base body 10, and a light reflection film 22 disposed on an upper surface of each light-emitting element 21. The structures of the base body 10, the light-emitting element 21, and the light reflection film 22, and the relationship between these components are as have been described in the first embodiment.

The plurality of light-emitting elements 21 are arranged in a one-dimensional or two-dimensional array on the upper surface of the base body 10. In the present embodiment, the plurality of light-emitting elements 21 are arranged in a two-dimensional array along two orthogonal directions, i.e., the x direction and the y direction, where an arrangement interval $P_x$ along the x direction and an arrangement interval $P_y$ along the y direction are the same. However, the arrangement directions are not limited to these. The intervals along the x direction and the y direction may be different, and the two arrangement directions may not be perpendicular to each other. Moreover, the arrangement intervals do not need to be regular intervals, but rather may be irregular intervals. For example, the light-emitting elements 21 may be arranged such that their interval increases from the center of the base body 10 toward the periphery of the base body 10.

The integrated light-emitting device 103 includes a plurality of light-reflecting members 15 located between light-emitting elements 21. Each light-reflecting member 15 has wall portions 15ax and 15ay and bottom portions 15b. As shown in FIG. 5B, each of the wall portions 15ay extending along the y direction is located between two adjacent light-emitting elements 21 along the x direction, and each of the wall portions 15ax extending along the x direction is located between two adjacent light-emitting elements 21 along the y direction. Thus, each light-emitting element 21 is surrounded by two wall portions 15ax extending along the x direction and two wall portions 15ay extending along the y direction. Each bottom portion 15b is located at a region 15r surrounded by the two wall portions 15ax and the two wall portions 15ay. In the present embodiment, with the arrangement intervals of the light-emitting elements 21 along the x direction and the y direction that are the same, the outer shape of the bottom portion 15b is a square.

Each of the bottom portions 15b has a through-hole 15e at the central part thereof, and the bottom portions 15b are located on the insulating layer 13 so that a light-emitting element 21 is disposed in the through-hole 15e in a plan view. Each of the through-holes 15e can have any appropriate shape and size that allow a respective one of the light-emitting elements 21 to be disposed in the through-hole. In order to allow light emitted from each of the light-emitting elements 21 to be also reflected by a respective one of the bottom portions 15b, the outer edge of a respective one of the through-holes 15e is preferably located near the light-emitting element 21. That is, in a top view, the interval between the through-hole 15e and the light-emitting element 21 is preferably narrow.

As shown in FIG. 5B, in a yz cross section, each wall portion 15ax includes a pair of slopes 15s extending along the x direction. Each slope 15s has two edges extending along the x direction such that the pair of slopes 15s are connected together at one of the two edges thereof to constitute an apex 15c. The other edge of each pair of slopes 15s is connected to a respective one of the bottom portions 15b of two adjacent regions 15r. Similarly, each wall portion 15ay extending along the y direction includes a pair of slopes 15t extending along the y direction. Each slope 15t has two edges extending along the y direction such that the pair of slopes 15t are connected together at one of the two edges to constitute an apex 15c. The other edge of each pair of slopes 15t is connected to a respective one of the bottom portions 15b of two adjacent regions 15r.

Each bottom portion 15b, two corresponding wall portions 15ax, and two corresponding wall portions 15ay define a light-emission space 17 having an opening. FIG. 5B illustrate light-emission spaces 17 arranged in three rows and three columns. The pairs of slopes 15s and the pairs of slopes 15t face the openings of the light-emission spaces 17.

Each light-reflecting member 15 has a light-reflecting property, so that, with the slopes 15s and 15t of the wall portions 15ax and 15ay, light emitted from the light-emitting elements 21 is reflected toward the opening of the light-emission space 17. Moreover, light incident on the bottom portion 15b is also reflected toward the opening of the light-emission space 17. Accordingly, light emitted from the light-emitting elements 21 can be efficiently incident on the light-transmissive layered structure 50.

Each of the light-emission spaces 17 demarcated by the light-reflecting members 15 serves as the smallest unit of light-emission space when the plurality of light-emitting elements 21 are driven separately. Each of the light-emission spaces 17 also serves as a smallest unit region for local-dimming when the light-emitting module 101, as a surface emission source, is viewed from the upper surface of the light-transmissive layered structure 50. With this structure, a light-emitting module in which local-dimming driving can be performed with respect to the smallest units of light-emission spaces, when the plurality of light-emitting elements 21 are driven separately. By simultaneously driving adjacent ones of light-emitting elements 21 to synchronize the timing of turning ON and OFF, local-dimming driving based on larger units of light-emission spaces is also possible.

The light-reflecting members 15 may be obtained by, for example, molding a resin that contains a reflective material composed of metal oxide particles such as titanium oxide, aluminum oxide, or silicon oxide; alternatively, the light-reflecting members 15 may be obtained by molding a resin that does not contain any reflective material, and disposing a reflective material. It is preferable that, the reflectance of each light-reflecting member 15 with respect to light emitted from the light-emitting element 21 is, for example, 70% or more.

The light-reflecting members 15 can be formed by a molding method using a mold or by stereolithography. Examples of molding methods using a mold include injection molding, extrusion molding, compression molding, vacuum forming, pneumatic forming, press forming, and the like. For example, through vacuum forming using a reflection sheet that is made of PET or the like, light-reflecting members 15 can be obtained in each of which the bottom portion 15b and the wall portions 15ax and 15ay are integrally formed. The thickness of the reflection sheet may be, for example, in a range of 100 μm to 500 μm.

The lower surface of the bottoms 15b of the light-reflecting members 15 and the upper surface of the insulating layer 13 are fixed together by an adhesion member or the like. The insulating layer 13 that is exposed through the through-holes 15e preferably has a light-reflective property. it is preferable that an adhesion member is disposed surrounding of the through-holes 15e so that light emitted from the light-emitting elements 21 is not incident at a portion between the insulating layer 13 and the light-reflecting members 15. For example, an adhesion member may be disposed in an annular shape along the outer edge of each through-hole 15e. The adhesion member may be a double-sided tape, a hotmelt-type adhesive sheet, or an adhesive liquid of a thermosetting resin or a thermoplastic resin. It is preferable that such adhesion members are highly incombustible. Instead of an adhesion member, screws, pins, or other means of coupling may be used for fixing.

Each region Ru surrounded by a light-reflecting member 15 can be regarded as a single light-emitting module 101 including a light-emitting element 21. In other words, the integrated light-emitting device 103 includes a plurality of light-emitting modules 101 that are arranged along the x direction and the y direction with an interval $P_x$ and an interval $P_y$.

The height $H_R$ of each light-reflecting member 15 is preferably equal to or less than 0.3 times, and more preferably equal to or less than 0.2 times, of the arrangement interval of the light-emitting modules 101. In the case in which the light-emitting modules 101 are arranged in a two-dimensional array, "the arrangement interval" as used herein refers to the shorter one of the intervals along the two directions. In the present embodiment, the arrangement interval $P_x$ along the x direction and the arrangement interval $P_y$ along the y direction are equal, and thus the height $H_R$ is equal to or less than 0.3 times the $P_x$ or $P_y$, i.e., $H_R \leq 0.3 P_x$ or $H_R \leq 0.3 P_y$. With the height $H_R$ of each light-reflecting member 15 that satisfies this condition, the distance between the light-transmissive layered structure 50 and the integrated light-emitting device 103 can be reduced, so that thin-type light-emitting modules can be obtained.

The light-transmissive layered structure 50 includes the half mirror 51. The structure of the light-transmissive layered structure 50 is as has been described in the first embodiment.

With the integrated light-emitting module 102, as in the first embodiment, unevenness in luminance can be reduced even with a thin-type structure.

A light-emitting module and integrated light-emitting module according to the present disclosure can be used for various light sources, such as backlight devices for liquid crystal display devices and illumination devices.

The above disclosed subject matter should be considered illustrative, and not restrictive, and the appended claims are intended to cover all modifications, enhancements, and other embodiments that fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light-emitting module comprising:
a base body comprising electrical conductor wirings;
a light-emitting element disposed on the base body and electrically connected to the electrical conductor wirings;
a sealing member covering the light-emitting element; and
a half mirror disposed on a light extraction surface side of the light-emitting element and spaced apart from the light-emitting element;
wherein a spectral reflectance of the half mirror under perpendicular incidence at a wavelength longer than a peak emission wavelength of light emitted from the light-emitting element is greater than a spectral reflectance of the half mirror under perpendicular incidence at the peak emission wavelength,
wherein, when an emission peak wavelength region is defined as a wavelength region with a predetermined width including a peak emission wavelength at a center thereof, a spectral reflectance of the half mirror under perpendicular incidence in a wavelength region located 50 nm from the emission peak wavelength region on a longer wavelength side of the light-emitting element is 10% or more greater than a spectral reflectance of the half mirror under perpendicular incidence in the emission peak wavelength region of the light-emitting element, and
wherein a ratio H/W of a height H to a width W of the sealing member is smaller than 0.5.

2. The light-emitting module of claim 1, wherein a spectral reflectance of the half mirror under perpendicular incidence in the emission peak wavelength region of the light-emitting element is in a range of 30% to 65%.

3. The light-emitting module of claim 1, wherein the ratio H/W is 0.3 or smaller.

4. The light-emitting module of claim 1, wherein 30% or more of a total amount of light emitted from the light-emitting element is emitted at an angle of elevation less than 20° with respect to the upper surface of the base body.

5. The light-emitting module of claim 1, wherein 40% or more of a total amount of light emitted from the light-emitting element is emitted at an angle of elevation that is less than 20° with respect to the upper surface of the base body.

6. The light-emitting module of claim 1, wherein the light-emitting element is flip-chip mounted on the base body.

7. The light-emitting module of claim 1, further comprising a wavelength conversion member disposed on the light extraction surface side of the light-emitting element, the wavelength conversion member being adapted to absorb a portion of light emitted from the light-emitting element and to emit light of a wavelength different from an emission wavelength of the light-emitting element.

8. An integrated light-emitting module comprising:
a plurality of the light-emitting modules of claim 1; and
a plurality of light-reflecting members, each disposed between an adjacent two of the plurality of light-emitting modules.

9. The integrated light-emitting module of claim 8, wherein a height of each light-reflecting member is equal to or less than 0.3 times a distance between the light-emitting modules.

10. The integrated light-emitting module of claim 8, wherein a height of each light-reflecting member is equal to or less than 0.2 times a distance between the light-emitting modules.

11. An integrated light-emitting module comprising:
a plurality of the light-emitting modules of claim 7; and
a plurality of light-reflecting members, each disposed between an adjacent two of the plurality of light-emitting modules.

12. The integrated light-emitting module of claim 11, wherein a height of each light-reflecting member is equal to or less than 0.3 times a distance between the light-emitting modules.

13. The integrated light-emitting module of claim 11, wherein a height of each light-reflecting member is equal to or less than 0.2 times a distance between the light-emitting modules.

14. The light-emitting module of claim 2, further comprising a wavelength conversion member disposed on the light extraction surface side of the light-emitting element, the wavelength conversion member being adapted to absorb a portion of light emitted from the light-emitting element and to emit light of a wavelength different from an emission wavelength of the light-emitting element.

15. The light-emitting module of claim 3, further comprising a wavelength conversion member disposed on the light extraction surface side of the light-emitting element, the wavelength conversion member being adapted to absorb a portion of light emitted from the light-emitting element and to emit light of a wavelength different from an emission wavelength of the light-emitting element.

16. The light-emitting module of claim 4, further comprising a wavelength conversion member disposed on the light extraction surface side of the light-emitting element, the wavelength conversion member being adapted to absorb a portion of light emitted from the light-emitting element and to emit light of a wavelength different from an emission wavelength of the light-emitting element.

\* \* \* \* \*